(12) United States Patent
Rozgo

(10) Patent No.: US 8,371,176 B2
(45) Date of Patent: Feb. 12, 2013

(54) MEDIA ISOLATED PRESSURE SENSOR

(75) Inventor: Paul Rozgo, Dublin, OH (US)

(73) Assignee: Honeywell International Inc., Morristown, NJ (US)

( * ) Notice: Subject to any disclaimer, the term of this patent is extended or adjusted under 35 U.S.C. 154(b) by 38 days.

(21) Appl. No.: 12/986,087

(22) Filed: Jan. 6, 2011

(65) Prior Publication Data

US 2012/0174682 A1    Jul. 12, 2012

(51) Int. Cl.
    *G01L 7/08* (2006.01)
(52) U.S. Cl. ............................................. 73/756; 73/727
(58) Field of Classification Search .................... 73/727, 73/756
    See application file for complete search history.

(56) References Cited

U.S. PATENT DOCUMENTS

| | | |
|---|---|---|
| 3,455,165 A | 7/1969 | Huet et al. |
| 4,129,042 A | 12/1978 | Rosvold |
| 4,168,630 A | 9/1979 | Shirouzu et al. |
| 4,303,903 A | 12/1981 | Matsuoka et al. |
| 4,314,225 A | 2/1982 | Tominaga et al. |
| 4,406,993 A | 9/1983 | Kurtz |
| 4,656,454 A | 4/1987 | Rosenberger |
| 4,763,098 A | 8/1988 | Glenn et al. |
| 4,939,497 A | 7/1990 | Nishida et al. |
| 5,012,677 A | 5/1991 | Shimada et al. |
| 5,025,667 A | 6/1991 | Strasser |
| 5,257,457 A | 11/1993 | Cotter |
| 5,438,876 A * | 8/1995 | Lewis .............................. 73/726 |
| 5,461,922 A * | 10/1995 | Koen ............................... 73/756 |
| 5,465,626 A | 11/1995 | Brown et al. |
| 5,485,753 A * | 1/1996 | Burns et al. ...................... 73/720 |
| 5,522,267 A * | 6/1996 | Lewis .............................. 73/726 |
| 5,625,151 A | 4/1997 | Yamaguchi |
| 5,811,690 A | 9/1998 | Hershey |
| 5,891,751 A | 4/1999 | Kurtz et al. |
| 5,955,771 A | 9/1999 | Kurtz et al. |

(Continued)

FOREIGN PATENT DOCUMENTS

| | | |
|---|---|---|
| DE | 10248281 | 4/2004 |
| DE | 2004029084 | 1/2006 |

(Continued)

OTHER PUBLICATIONS

Honeywell, "Pressure Sensors Miniature Signal Conditioned, 40PC Series," 3 pages, prior to May 14, 2008.

(Continued)

*Primary Examiner* — Lisa Caputo
*Assistant Examiner* — Punam Roy
(74) *Attorney, Agent, or Firm* — Seager Tufte & Wickhem LLC

(57) ABSTRACT

A media isolated pressure sensor is disclosed that helps improve performance and reduce cost. In one illustrative embodiment, a pressure sensor may include a carrier having one or more holes defined therein. The carrier may be coupled to a diaphragm on one side, and a pressure sensing die on the other, with the pressure sensing die in fluid communication with the hole in the carrier. The carrier, diaphragm and pressure sense die may form a transfer fluid cavity, which is filled with a pressure transfer fluid. An input pressure from a media to be sensed may be provided to the diaphragm, which transmits the pressure to the pressure sensing die via the pressure transfer fluid. The pressure sensing die remains isolated from the media to be sensed.

22 Claims, 1 Drawing Sheet

U.S. PATENT DOCUMENTS

| | | | |
|---|---|---|---|
| 5,973,590 | A | 10/1999 | Kurtz et al. |
| 5,999,082 | A | 12/1999 | Kurtz et al. |
| 6,330,829 | B1 | 12/2001 | Kurtz et al. |
| 6,351,996 | B1 | 3/2002 | Nasiri et al. |
| 6,550,337 | B1 * | 4/2003 | Wagner et al. ............... 73/715 |
| 6,591,686 | B1 | 7/2003 | Kurtz |
| 6,868,731 | B1 | 3/2005 | Gatesman |
| 6,931,938 | B2 | 8/2005 | Knirck et al. |
| 6,938,490 | B2 * | 9/2005 | Wagner et al. ............... 73/708 |
| 6,945,120 | B1 | 9/2005 | Marcus et al. |
| 7,036,384 | B2 | 5/2006 | Tanaka et al. |
| 7,073,375 | B2 | 7/2006 | Parker et al. |
| 7,077,008 | B2 | 7/2006 | Pham et al. |
| 7,168,326 | B2 | 1/2007 | Toyoda et al. |
| 7,194,910 | B2 | 3/2007 | Gatesman |
| 7,331,241 | B1 | 2/2008 | Kurtz et al. |
| 7,436,037 | B2 | 10/2008 | Kurtz et al. |
| 7,603,906 | B2 | 10/2009 | Kroger et al. |
| 7,610,812 | B2 | 11/2009 | Kurtz et al. |
| 7,635,077 | B2 | 12/2009 | Schubert |
| 7,647,835 | B2 | 1/2010 | Speldrich |
| 7,677,109 | B2 | 3/2010 | Bentley et al. |
| 7,759,945 | B2 | 7/2010 | Wade |
| 7,802,401 | B2 | 9/2010 | Wild et al. |
| 7,930,944 | B2 | 4/2011 | Machir et al. |
| 2002/0029639 | A1 * | 3/2002 | Wagner et al. ............... 73/756 |
| 2003/0150275 | A1 * | 8/2003 | Wagner et al. ............... 73/715 |
| 2007/0271069 | A1 | 11/2007 | Dmytriw et al. |
| 2007/0289380 | A1 | 12/2007 | Lin et al. |
| 2008/0222884 | A1 | 9/2008 | Bradley et al. |
| 2010/0257937 | A1 | 10/2010 | Kurtz |

FOREIGN PATENT DOCUMENTS

| | | |
|---|---|---|
| DE | 102004051219 | 5/2006 |
| DE | 102007015476 | 10/2008 |
| EP | 0736757 | 10/1996 |
| EP | 0828147 | 11/1998 |
| EP | 1074827 | 2/2001 |
| EP | 1255099 | 11/2002 |
| EP | 1677090 | 5/2006 |
| EP | 1813300 | 1/2007 |
| EP | 1764598 | 3/2007 |
| GB | 2370638 | 3/2002 |
| JP | 4155233 | 5/1992 |
| JP | 8075581 | 3/1996 |
| JP | 11023397 | 1/1999 |
| JP | 11337431 | 12/1999 |
| JP | 2000046667 | 2/2000 |
| JP | 2000180282 | 6/2000 |
| JP | 2000180283 | 6/2000 |
| JP | 2000352540 | 12/2000 |
| JP | 2001208626 | 8/2001 |
| JP | 2003057138 | 2/2003 |
| WO | 2004001358 | 12/2003 |

OTHER PUBLICATIONS

Honeywell, "40PC Slides," 2 pages, prior to May 14, 2008.

European Search Report, Application No. 12150214.0-1236.

* cited by examiner

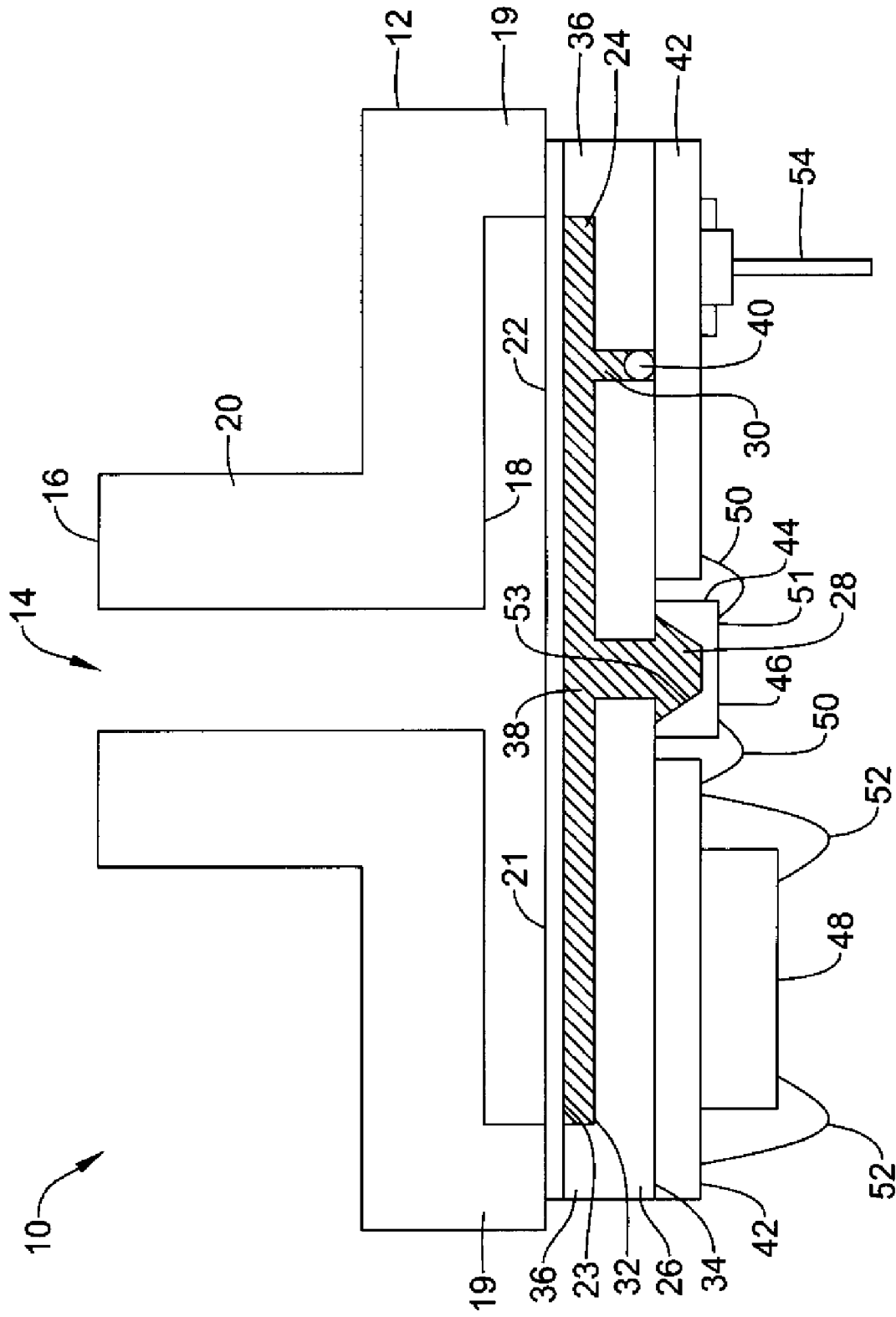

MEDIA ISOLATED PRESSURE SENSOR

TECHNICAL FIELD

The present disclosure relates generally to pressure sensors, and more particularly, to media isolated pressure sensors that utilize a pressure transfer fluid between a pressure sense element and a media to be sensed.

BACKGROUND

Pressure sensors are used in a wide variety of applications including, for example, commercial, automotive, aerospace, industrial, and medical applications. Pressure sensors often use a pressure sense element that is configured to detect a pressure of a media to be sensed by converting mechanical stress caused by the incoming pressure of the media into an electrical output signal. In some applications, it may be desirable to isolate the pressure sense element from the media. This is sometimes accomplished by providing a pressure transfer fluid (such as oil) between the pressure sense element and a diaphragm. Typically, pressure from the media is applied to the diaphragm, which is then transferred through the pressure transfer fluid and ultimately to the pressure sense element. While such configurations may help isolate and protect the pressure sense element from the media, they can be expensive to build, and they can have relatively high offset variation with temperature, often caused by relatively high aspect ratios (height to width, traditionally ranging from 1:1 to 1:10) of the cavity holding the pressure transfer fluid, which must be calibrated out to produce accurate results.

SUMMARY

The present disclosure relates generally to pressure sensors, and more particularly, to media isolated pressure sensors that utilize a pressure transfer fluid between a pressure sense element and a media to be sensed. The media to be sensed may be a liquid or gas, depending on the application.

In one illustrative embodiment, a pressure sensor may include a housing that defines a fluid passageway. A diaphragm may be positioned to seal one end of the fluid passageway, such that a media entering the other end of the fluid passageway may engage and apply pressure to the diaphragm. The diaphragm may include metal, plastic, ceramic, or any other suitable material. A carrier may be secured to the diaphragm opposite the housing. In some instances, the carrier may have a side wall that extends out from the carrier to help form a transfer fluid cavity between the diaphragm and the carrier.

The carrier may include an opening extending through the carrier. A pressure sensing die may be mounted to the carrier. A pressure sensing diaphragm of the pressure sensing die may be in fluid communication with the opening in the carrier, and thus in fluid communication with the transfer fluid cavity. When so provided, the transfer fluid cavity may be formed, at least in part, by the diaphragm, the carrier and the pressure sensing diaphragm of the pressure sensing die. A pressure transfer fluid may be disposed within the transfer fluid cavity.

In some instances, a substrate such as a printed circuit board may be secured to the carrier, adjacent to the pressure sensing die. Wire bonds may be used to electrically connect one or more bond pads of the pressure sensing die to one or more bond pads of the printed circuit board. Signal conditioning circuitry may be provided on the printed circuit board to receive a signal from the pressure sensing die and condition the signal to provide a conditioned output signal from the pressure sensor.

The preceding summary is provided to facilitate a general understanding of some of the innovative features of the present disclosure, and is not intended to be a full description. A full appreciation of the disclosure can be gained by taking the entire specification, claims, drawings, and abstract as a whole.

BRIEF DESCRIPTION OF THE DRAWING

The disclosure may be more completely understood in consideration of the following description of various illustrative embodiments in connection with the accompanying drawing, in which:

FIG. 1 is a schematic cross-sectional view of an illustrative pressure sensor.

While the disclosure is amenable to various modifications and alternative forms, specifics thereof have been shown by way of example in the drawing and will be described in detail. It should be understood, however, that the intention is not to limit the disclosure to the particular illustrative embodiments described herein. On the contrary, the intention is to cover all modifications, equivalents, and alternatives falling within the spirit and scope of the disclosure.

DESCRIPTION

The following description should be read with reference to the drawing. The description and the drawing, which is not necessarily to scale, depicts an illustrative embodiment and is not intended to limit the scope of the disclosure. The illustrative embodiment depicted is intended only as exemplary.

As used herein, the term "fluid" is not intended to be limited to a liquid. Rather, the term "fluid" is intended to include any material subject to flow, such as, but not limited to, liquids and/or gases.

FIG. 1 is a schematic cross-sectional view of an illustrative media isolated pressure sensor 10. In the illustrated embodiment, the pressure sensor 10 may include a housing 12, which is configured to provide a fluid passageway 14 that transmits a media (fluid or gas) from a customer application into the pressure sensor 10. The housing 12 may be formed from plastic, polyamide, ceramic, metal, or any other suitable material. As shown in FIG. 1, the housing 12 may define a fluid passageway 14 that extends from a first end 16 to a second end 19. The first end 16 may receive a media to be sensed, and may deliver the media to the second end 19.

In some embodiments, the second end 19 of the fluid passageway 14 is wider than the first end 16, although this is not required. In some cases, a transition 18 or base may be provided, as shown in FIG. 1. In some instances, the housing 12 may include an elongated structure 20 extending up from the transition 18 or base, which may define at least part of the elongated fluid passageway 14. In some cases, the elongated structure 20 may include a generally tubular member extending away from the transition 18 or base, but this is just one example. It is contemplated that the opening at the first end 16 of the fluid passageway may include one of a variety of interface options and/or connections, depending on the application. It is also contemplated that the elongated structure 20 may include an elbow, or may take on any other desired configuration or shape, depending on the application. In other embodiments, the elongated structure 20 may include a threaded region for threadably engaging another threaded component. In some embodiments, the elongated structure 20 may not be present at all, leaving only the transition 18 or base. It is contemplated that the fluid passageway 14 may be of any shape or size desired according to the user's needs.

In some instances, the second end 19 of the fluid passageway of the housing may include one or more sidewalls extending downward from the transition 18 or base, as shown in FIG. 1. When so provided, this may help provide a space between the transition 18 or base and a diaphragm 22.

The diaphragm 22 may have a first side 21 and a second side 23. In some instances, the first side 21 of the diaphragm 22 may be attached to the housing 12, and may seal the second end 19 of the fluid passageway 14. In some instances, the diaphragm 22 may be a thin, solid material configured to provide media isolation between the media to be sensed and a pressure sensing die 44. In some instances, the diaphragm 22 may be attached such that the first side 21 of the diaphragm is bonded to the housing 12, and the second side 23 of the diaphragm faces away from the housing 12. It is contemplated that the diaphragm 22 may be bonded to the housing 12 using welding, an adhesive, a seal, a gasket, or any other suitable bonding or sealing mechanism (e.g. solder, eutectic, etc.).

The illustrated pressure sensor 10 may further include a carrier 26, which in some cases, may be attached to the second side 23 of the diaphragm 22. It is contemplated that the carrier 26 may be formed from any suitable material, such as, but not limited to, ceramic, metal, plastic, etc. The carrier 26 may include a first side surface 32 and a second side surface 34. In some embodiments, the carrier 26 may include one or more side walls 36 that extend upward from the first side surface 32, as shown in FIG. 1. The side walls 36, in combination with the first side surface 32 of the carrier 26 and the second side surface 23 of the diaphragm 22, may form at least part of a fluid transfer cavity 38, which as further described below, can receive a pressure transfer fluid 2. In some embodiments, the pressure transfer fluid 24 may be an oil, a gel, or any other suitable pressure transfer fluid, as desired. In some embodiments, the oil may be a silicone based oil. In some instances, the pressure transfer fluid 24 may be an incompressible fluid, sometime with a relatively low temperature expansion coefficient.

In some embodiments, the carrier 26 may include a first opening 28 extending from the first side surface 32 to the second side surface 34. A pressure sensing die 44 may be mounted to the carrier 26 adjacent to the first opening 28. In some cases, the pressure sensing die 44 may be mounted to the carrier 26 using an adhesive such as a silicone, RTV (room temperature vulcanizing), a silicone-epoxy, a soft epoxy, or a regular or hard epoxy. In some cases, the adhesive may have a thickness suitable for providing mechanical stress isolation between the pressure sensing die 44 and the carrier 26, such that the pressure sensing die 44 is effectively unconstrained relative to the carrier 26. In some cases, the thickness of adhesive may be thick enough for adequate adherence of pressure sense die 44 to carrier 26, but not so thick so as to interfere with the bonding or diaphragm of pressure sense die 44. In other cases, the pressure sensing die 44 may be mounted to the carrier 26 using other suitable bonding mechanisms, such as solder, eutectic, etc.

In some cases, the pressure sensing die 44 may be mounted over the first opening 28 in carrier 26 as shown, and may be sized to expose the back side of the pressure sensing diaphragm 46 to the second side 34 of the carrier 26 and/or the second side 23 of the diaphragm 22. In some instances, the pressure sensing die 44 may include a front side 51 and a back side 53. The back side 53 may include an etched cavity that defines at least part of the pressure sensing diaphragm 46, which extends along the front side 51 of the pressure sensing die 44. The pressure sensing diaphragm 46 may include one or more piezoresistive elements (not explicitly shown). The front side 51 of the pressure sensing die 44 may also include one or more bond pads, and the back side 53 of the pressure sensing die 44 may face the second side 34 of the carrier 26. In this instance, a pressure applied to the fluid passageway 14 of the housing via a media to be sensed may be transmitted to the back side 53 of pressure sensing diaphragm 46 via the diaphragm 22, the fluid transfer fluid 24, and the first opening 28 in the carrier 26. However, the pressure sensing diaphragm 46 may remain isolated from the media to be sensed.

In some embodiments, the pressure sensing die 44 may be a micromechanical sensor element fabricated using a silicon wafer and suitable fabrication techniques. The pressure sensing die 44 may have one or more pressure sensing elements and/or other circuitry (e.g. trim circuitry, signal conditioning circuitry, etc.) formed using any suitable fabrication or printing techniques. In some cases, the pressure sensing die 44 may include a pressure sensing diaphragm 46 including one or more sensing elements, such as piezoresistive sensing components, formed thereon for sensing a deflection and thus a pressure differential between a top 51 and bottom 53 side of the pressure sensing diaphragm 46. As indicated above, in some cases, the pressure sensing diaphragm 46 may be fabricated by back-side etching a silicon die, however, it is contemplated that any other suitable process may be used, as desired.

When provided, the piezoresistive components may be configured to have an electrical resistance that varies according to an applied mechanical stress (e.g. pressure sensing diaphragm 46 deflection). In some cases, the piezoresistive components may include a silicon piezoresistive material, however, other non-silicon materials may be used. In some cases, the piezoresistive components may be connected in a Wheatstone bridge configuration (full or half bridge). It is to be understood that the piezoresistive components are only one example of a pressure sensing element that can be used, and it is contemplated that any other suitable sensing elements may be used, as desired.

In some embodiments, the carrier 26 may include a second, or auxiliary, opening 30 extending from the first side surface 32 to the second side surface 34. The second opening 30 may be configured such that the transfer fluid cavity 38 may be filled with a pressure transfer fluid 24 in a vacuum once the pressure sensing die 44 has been mounted to seal the first opening 28. Prior to filling the transfer fluid cavity 38, the transfer fluid cavity formed by the diaphragm 22, carrier 26 and pressure sensing die 44 may be cleaned using any suitable method to remove any residual debris or other unwanted material or residue. Once the transfer fluid cavity 38 has been filled, and in some embodiments, the second opening may be sealed with a swedged (and possibly welded) metal ball 40. It is contemplated that in some embodiments, the sealing mechanism may be a ceramic ball. However, it is contemplated that other suitable technique of sealing the second opening 30 may be used as desired, such as, but not limited to, adhesives, solder, eutectic, etc.

The illustrative design of the pressure sensor 10 may allow for the height of the pressure transfer fluid 24 to be relatively small. As a result, the aspect ratio (height to width in FIG. 1) of the pressure transfer fluid may help to reduce the effect of temperature expansion of the pressure transfer fluid 24 on the output response of the pressure sensor 10. As used herein, the aspect ratio is generally defined as the distance (height) of the pressure fluid 24 between the second side 23 of the diaphragm 22 and the first side surface 32 of the carrier 26 to the width of the pressure fluid 24 between each of the side walls 36 of the carrier 26. It is contemplated that the aspect ratio of the pressure sensor 10 may be less than a 1:10. For example, the aspect ratio of the pressure sensor 10 may be 1:20 or lower without negatively affecting the overall size of the pressure sensor 10.

With the transfer fluid cavity 38 has been filled with the pressure transfer fluid 24 and sealed, a printed circuit board (PCB) or other substrate 42 may be mounted on the second side surface 34 of the carrier 26, if desired. As shown in FIG. 1, the placement of substrate 42 may allow the substrate 42 to be electrically connected to the pressure sensing die 44 via, for example, direct wire bonds 50, but this is not required. In some embodiments, the substrate 42 may include one or more bond pads, and the pressure sense die 44 may include one or more bond pads. Wire bonds may be used to electrically connect one or more of the bond pads of the pressure sense die 44 and one or more bond pads of the substrate 42. It is further contemplated that in some embodiments, the substrate 42 may include circuitry for compensation of bridge signals from the pressure sense die 44. However, in other embodiments, the substrate may not include circuitry for compentation. Also, in some instances, the pressure sensor 10 may include one or more terminals 54 for connecting the substrate 42 to additional boards, interconnect, and/or other components as desired. In some instances, the terminals 54 may be surface mount terminals. However, it is contemplated the terminals 54 may be any type of terminal desired for a particular applications.

In operation, a media to be sensed can be provided to the first end 16 of the fluid passageway 14. The media to be sensed may have a pressure, which is transmitted through the media to the diaphragm 22. The applied pressure deforms the diaphragm 22, and transmits the pressure to the back side 51 of the pressure sensing die 44 via the pressure transfer fluid 24. A pressure difference between the pressure of the media to be sensed and atmosphere causes a deflection of the pressure sensing diaphragm 46 of the pressure sense die 44, which then stresses one or more piezoresistive elements on the pressure sensing diaphragm 46. Applying a current through the piezoresistive elements may provide a signal that corresponds to the applied pressure in the media to be sensed. In some cases, the resulting signal may be conditioned by conditioning circuitry 48 and output via electrical leads (not explicitly shown).

As discussed above, in some instances, the pressure sensor 10 may include optional signal conditioning circuitry 48 mounted on the substrate 42. In some cases, the signal conditioning circuitry may include an ASIC (Application Specific Integrated Circuit) or other electronics. In some cases, the optional signal conditioning circuitry 48 may include amplification, analog-to-digital conversion, offset compensation circuitry, and/or other suitable signal conditioning electronics. When so provided, the signal conditioning circuitry 48 may receive a signal from the pressure sensing die 44, and condition and/or process the signal for transmission from the pressure sensor 10. While an ASIC die is shown, it is contemplated that signal conditioning circuitry 48 may include any suitable signal conditioning circuitry including any suitable microprocessor or microcontroller, discrete components, or any other suitable circuitry, as desired.

In some cases, signal conditioning circuitry 48 may be mounted to the substrate 42 using an adhesive or any other suitable bonding mechanism (e.g. solder, eutectic, etc.). In some embodiments, the signal conditioning circuitry 48 may be fabricated directly on the substrate 42. As shown, signal conditioning circuitry 48 may be secured to the substrate 42 adjacent to the pressure sense die 44, and may be electrically connected to the substrate 42 via direct wire bonds 52, but this is not required. In some embodiments, the signal conditioning circuit 48 may be electrically connected to pressure sensing die 44 via direct die-to-die wire bonds. Trace conductors may be connected to connectors, leads or terminals of the pressure sensor 10, when desired.

Those skilled in the art will recognize that the present disclosure may be manifested in a variety of forms other than the specific embodiments described and contemplated herein. Accordingly, departure in form and detail may be made without departing from the scope and spirit of the present disclosure.

What is claimed is:

1. A pressure sensor, comprising:
 a housing defining a fluid passageway, wherein the fluid passageway has a first end and a second end;
 a diaphragm having a first side and a second side, the first side of the diaphragm mounted adjacent to the second end of the fluid passageway of the housing;
 a carrier having a first side and a second side, and a first opening extending between the first side and the second side of the carrier, the first side of the carrier mounted adjacent to the second side of the diaphragm;
 a pressure sensing die mounted adjacent to the second side of the carrier, the pressure sensing die including a pressure sensing diaphragm that is in fluid communication with the first opening of the carrier;
 a transfer fluid cavity formed, at least in part, by the second side of the diaphragm, the first side of the carrier and the pressure sensing diaphragm of the pressure sensing die, the transfer fluid cavity having a height dimension defined between the second side of the diaphragm and the first side of the carrier, and a width dimension that is substantially perpendicular to the height dimension;
 a pressure transfer fluid disposed within the transfer fluid cavity; and
 wherein an aspect ratio of the height dimension to the width dimension of the transfer fluid cavity is less than 1:10.

2. The pressure sensor of claim 1, wherein the pressure sensing die includes a front side and a back side, wherein the back side includes an etched cavity that defines at least part of the pressure sensing diaphragm, which extends along the front side of the pressure sensing die, the pressure sensing diaphragm including one or more piezoresistive elements, the front side of the pressure sensing die including one or more bond pads, and the back side of the pressure sensing die faces the second side of the carrier.

3. The pressure sensor of claim 1, wherein:
 the carrier includes a second opening extending between the first side and the second side of the carrier; and
 a seal disposed in the second opening.

4. The pressure sensor of claim 3, wherein the seal includes a metal ball.

5. The pressure sensor of claim 1, further comprising a pressure opening defined by the first end of the fluid passageway of the housing.

6. The pressure sensor of claim 5, wherein a media to be sensed is provided from the pressure opening of the housing, through the fluid passageway of the housing and to the first side of the diaphragm.

7. The pressure sensor of claim 1, wherein the pressure transfer fluid is a liquid.

8. The pressure sensor of claim 7, wherein the pressure transfer fluid is an oil.

9. The pressure sensor of claim 1, further comprising a substrate mounted adjacent to the second side of the carrier.

10. The pressure sensor of claim 9, wherein the pressure sensing die is wire bonded to the substrate.

11. The pressure sensor of claim 9, further comprising signal conditioning circuitry mounted to the substrate, wherein the signal conditioning circuitry is configured receive a signal from the pressure sensing die and condition the signal to provide a conditioned output signal.

12. The pressure sensor of claim 11, wherein the signal conditioning circuitry is wire bonded to the substrate.

13. The pressure sensor of claim 1, wherein the aspect ratio of the height dimension to the width dimension of the transfer fluid cavity is less than 1:20.

14. A pressure sensor, comprising:
a housing having a base portion and an elongated structure extending from the base portion, wherein the elongated structure has a width dimension that is less than a width dimension of the base portion, the elongated structure configured to interface the pressure sensor with a pressure source, the housing defining a fluid passageway, wherein the fluid passageway has a first end formed by the elongated structure and a second end formed by the base portion;
a diaphragm sealing the second end of the fluid passageway of the housing;
a carrier having a first side and a second side, with a side wall extending upward from the first side to define side walls, the first side and the side wall defining at least part of a transfer fluid cavity, the carrier having an opening extending from the second side to the first side of the carrier and into the fluid transfer cavity;
the side wall of the carrier mounted to the diaphragm opposite to the housing;
a pressure sensing die mounted to the second side of the carrier, the pressure sensing die including a pressure sensing diaphragm that is in fluid communication with the opening in the carrier;
the transfer fluid cavity formed, at least in part, by the diaphragm, the first side of the carrier, the side wall of the carrier, and the pressure sensing diaphragm of the pressure sensing die; and
a pressure transfer fluid filling the transfer fluid cavity.

15. The pressure sensor of claim 14, further comprising:
a substrate mounted to the second side of the carrier adjacent to the pressure sensing die;
wherein the substrate includes bond pads that are in electrical communication with one or more bond pads of the pressure sensing die.

16. The pressure sensor of claim 15, further comprising:
signal conditioning circuitry mounted to the substrate, wherein the signal conditioning circuitry is configured receive a signal from the pressure sensing die and to condition the signal to provide a conditioned output signal from the pressure sensor.

17. The pressure sensor of claim 15, further comprising:
one or more wire bonds for electrically connecting one or more bond pads of the substrate with one or more bond pads of the pressure sensing die.

18. The pressure sensor of claim 14, wherein the pressure transfer fluid is a liquid.

19. The pressure sensor of claim 14, wherein the pressure transfer fluid is an oil.

20. A pressure sensor comprising:
a housing having a first end, a second end, and one or more lateral side walls extending from the second end, with the first end defining a pressure opening;
a metal diaphragm having a first side and a second side, the first side of the diaphragm mounted to the lateral side walls of the housing;
a carrier having a first side, a second side, and one or more lateral side walls extending upward from the first side surface, the carrier further including a first opening and a second opening each extending between the first side and the second side of the carrier, wherein the one or more lateral side walls of the carrier are mounted to the second side of the diaphragm;
a pressure sensing die mounted to the carrier, the pressure sensing die including a pressure sensing diaphragm and one or more piezoresistive elements positioned on the pressure sensing diaphragm, wherein the pressure sensing die is positioned over the first opening in the carrier;
a sealing mechanism disposed in the second opening of the carrier;
a transfer fluid cavity formed, at least in part, by the diaphragm, the carrier and the pressure sensing die;
a pressure transfer fluid disposed within the transfer fluid cavity;
a printed circuit board mounted to the second side of the carrier adjacent to and wire bonded to the pressure sensing die; and
signal conditioning circuitry mounted on the printed circuit board, wherein the signal conditioning circuitry is configured receive a signal from the pressure sensing die and condition the signal to provide a conditioned output signal from the pressure sensor.

21. The pressure sensor of claim 20, wherein the pressure transfer fluid is an oil.

22. A pressure sensor, comprising:
a housing having a first end, a second end, and a fluid passageway extending from the first end to the second end, wherein the fluid passageway has a cross-sectional area that transitions from a first cross-sectional area to a second cross-sectional area at a transition region of the housing, wherein the first cross-sectional area is smaller than the second cross-sectional area, and wherein the second cross-sectional area extends to the second end of the housing;
a diaphragm having a first side and a second side, the first side of the diaphragm exposed to the second cross-sectional area of the fluid passageway of the housing;
a carrier having a first side and a second side, and a first opening extending between the first side and the second side of the carrier, the first side of the carrier mounted adjacent to the second side of the diaphragm;
a pressure sensing die mounted adjacent to the second side of the carrier, the pressure sensing die including a pressure sensing diaphragm that is in fluid communication with the first opening of the carrier;
a transfer fluid cavity formed, at least in part, by the second side of the diaphragm, the first side of the carrier and the pressure sensing diaphragm of the pressure sensing die; and
a pressure transfer fluid disposed within the transfer fluid cavity.

* * * * *